(12) United States Patent
Yan et al.

(10) Patent No.: US 12,538,824 B2
(45) Date of Patent: Jan. 27, 2026

(54) DIE SUBSTRATE TO OPTIMIZE SIGNAL ROUTING

(71) Applicant: NVIDIA Corporation, Santa Clara, CA (US)

(72) Inventors: Shuanghu Yan, Santa Clara, CA (US); Xiaozhuo Cai, Santa Clara, CA (US); Hao Zhu, Santa Clara, CA (US); Dinghai Yi, Santa Clara, CA (US); Huaming Li, Santa Clara, CA (US)

(73) Assignee: NVIDIA Corporation, Santa Clara, CA (US)

( * ) Notice: Subject to any disclaimer, the term of this patent is extended or adjusted under 35 U.S.C. 154(b) by 513 days.

(21) Appl. No.: 18/090,741

(22) Filed: Dec. 29, 2022

(65) Prior Publication Data

US 2023/0317586 A1    Oct. 5, 2023

(30) Foreign Application Priority Data

Apr. 1, 2022    (CN) .......................... 202210347787.3

(51) Int. Cl.
| | |
|---|---|
| *H01L 25/16* | (2023.01) |
| *H01L 21/48* | (2006.01) |
| *H01L 23/00* | (2006.01) |
| *H01L 23/498* | (2006.01) |

(Continued)

(52) U.S. Cl.
CPC .... *H01L 23/49822* (2013.01); *H01L 21/4857* (2013.01); *H01L 23/49816* (2013.01); *H01L 23/49833* (2013.01); *H01L 24/81* (2013.01); *H01L 25/162* (2013.01); *H01L 25/50* (2013.01); *H10D 1/68* (2025.01); *H01L 24/16* (2013.01); *H01L 24/32* (2013.01); *H01L 24/73* (2013.01); *H01L 2224/16227* (2013.01);

(Continued)

(58) Field of Classification Search
CPC ....... H01L 23/498; H01L 25/16; H01L 25/00; H01L 21/48
See application file for complete search history.

(56) References Cited

U.S. PATENT DOCUMENTS 10,867,896 B2 * 12/2020 Chen ................. H01L 23/49816
2012/0153504 A1 * 6/2012 Arana ..................... H01L 23/13
257/777

(Continued)

OTHER PUBLICATIONS

Crow; "TDK's Guide to Multilayer Ceramic Capacitors for Use with Conductive Epoxies"; TDK Components USA, Inc.; Oct. 2013; 5 pgs.

*Primary Examiner* — Thao P Le

(57) ABSTRACT

A die substrate, including a dielectric body, the body having a first body surface, a second body surface on an opposite side and body edge surfaces located in between. Current-carrying metal lines located in the dielectric body. One or more of the metal lines routed to one or more of the body edge surfaces. A termination layer located on the at least one body edge surface and electrically connected to the least one of the metal lines routed to the body edge surfaces. Electrically conductive plating located on the at least one body edge surface. The plating connected to the termination layer for an electrical current connection or a ground connection to the at least one metal line. A method of manufacturing an integrated circuit package, the package and a computer having the die substrate are also disclosed.

18 Claims, 4 Drawing Sheets

Figure 1A:
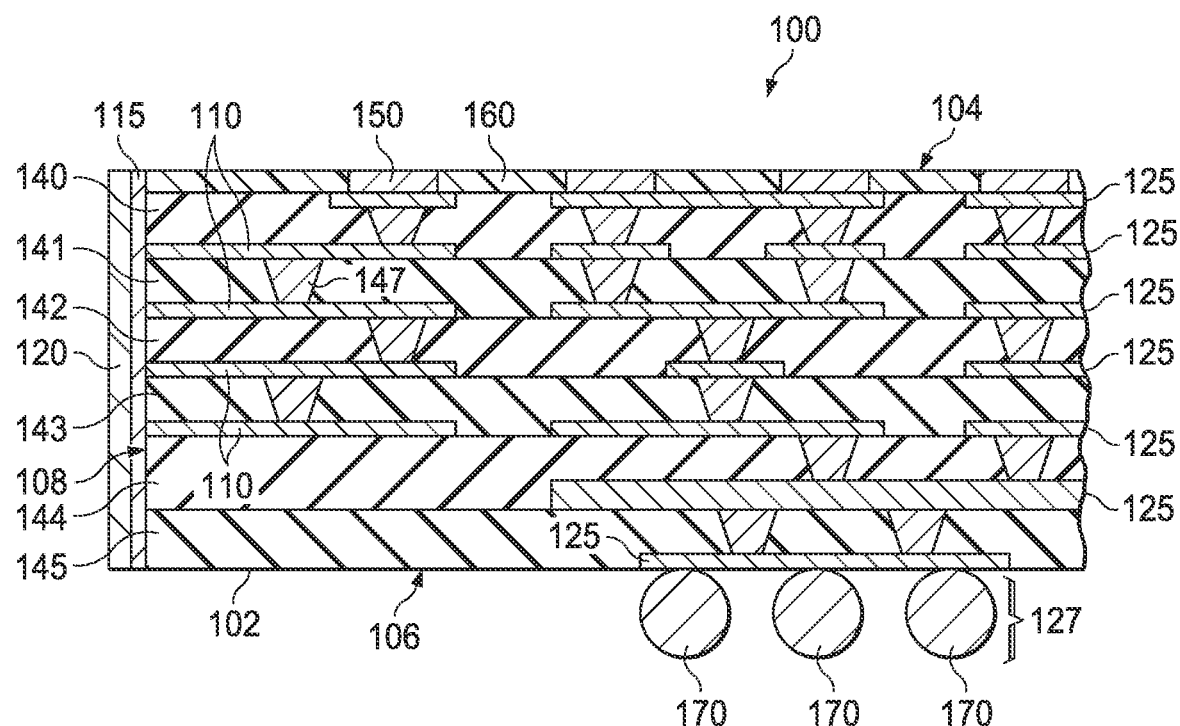

(51) Int. Cl.
*H01L 25/00* (2006.01)
*H10D 1/68* (2025.01)

(52) U.S. Cl.
CPC ............... *H01L 2224/32225* (2013.01); *H01L 2224/73204* (2013.01); *H01L 2224/8138* (2013.01)

(56) References Cited

U.S. PATENT DOCUMENTS

| | | | |
|---|---|---|---|
| 2013/0109135 A1* | 5/2013 | Lee | H01L 25/0657 438/107 |
| 2018/0366437 A1* | 12/2018 | Chen | H01L 23/5389 |
| 2020/0105663 A1* | 4/2020 | Tsai | H01L 23/5389 |
| 2023/0035627 A1* | 2/2023 | Patil | H01L 21/568 |
| 2025/0015038 A1* | 1/2025 | Magni | H01L 23/49517 |

\* cited by examiner

DIE SUBSTRATE TO OPTIMIZE SIGNAL ROUTING

CROSS-REFERENCED TO RELATED APPLICATION

This application claims priority to CN Patent Application No. 202210347787.3, entitled "A DIE SUBSTRATE TO OPTIMIZE SIGNAL ROUTING", filed Apr. 1, 2022. The above-listed application is commonly assigned with the present application is incorporated herein by reference as if reproduced herein in its entirety.

TECHNICAL FIELD

This application is directed, in general, to die substrates and methods of manufacturing thereof, and in particular, an integrated circuit package that includes the die substrate.

BACKGROUND

With the advancement of semiconductor process technology, the same size die (or chip) can integrate more and more transistors, to give greater functionality and performance for higher memory bandwidth and therefore, high current demand applications, such as in Graphics Processing Clusters (GPCs), Texture Processing Clusters (TPCs) or other multiprocessor application. However, greater functionality and higher current demand in turn requires a larger number of solder balls, to provide a larger and/or denser ball grid array (BGA) size on the underside of a die substrate to carry current. Such high current demands and increasing BGA sizes places an increasing burden on printed circuit board (PCB) design layout.

Reducing the size of the BGA dedicated to current delivery and providing a more efficient current conduction capability are important to furthering the goal of increasing computing performance.

SUMMARY

One aspect provides a die substrate, the die substrate including a dielectric body, current-carrying metal lines located in the dielectric body, a termination layer located on the at least one body edge surface and an electrically conductive plating located on the at least one body edge surface. The dielectric body has a first body surface, a second body surface on an opposite side of the dielectric body as the first surface, and body edge surfaces located in between the first and second surfaces. At least one or more of the current-carrying metal lines are routed to one or more of the body edge surfaces. The termination layer is electrically connected to the least one of the metal lines routed to the body edge surfaces. The electrically conductive plating is connected to the termination layer for an electrical current connection or a ground connection to the at least one the current-carrying metal line.

Another aspect is a method of manufacturing an integrated circuit package that includes providing the die substrate. The method can include mounting the die substrate to a package substrate, where the electrically conductive plating is electrically connected to a current-carrying line on the package substrate, mounting a capacitor on the package substrate, where the capacitor is electrically connected to the electrically conductive plating and mounting a die to die mounting pads located on the first body surface.

Another aspect is an integrated circuit package that includes the die substrate. The package can include a die connected to die mounting pads located on the first body surface of the die substrate, where some of the current-carrying metal lines connected to die mounting pads. The package can include a package substrate, where the die substrate is mounted thereto and the electrically conductive platings are electrically connected to current-carrying lines on the package substrate. The package can include one or more capacitors located on the package substrate, wherein each one of the capacitors is electrically connected to one of the electrically conductive platings of the die substrate.

Another aspect is a computer having one or more circuits that include any embodiments of the dies substrate disclosed herein.

BRIEF DESCRIPTION

Figure 1B:
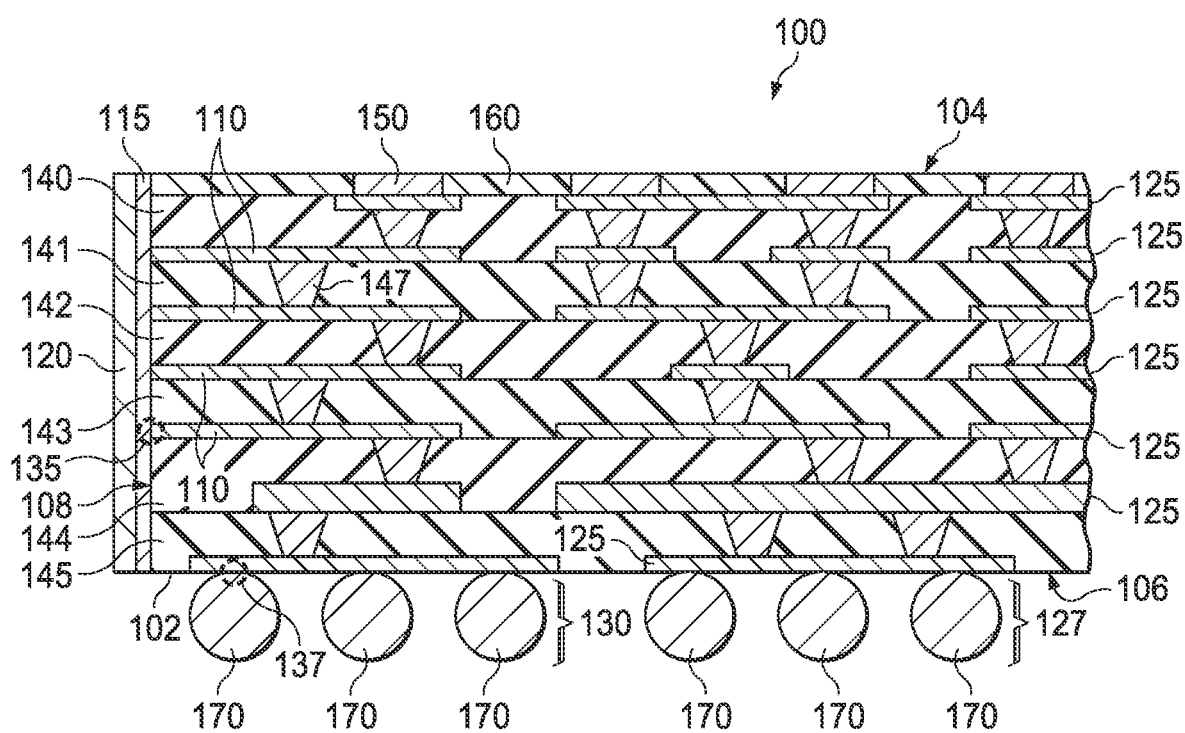
Figure 2:
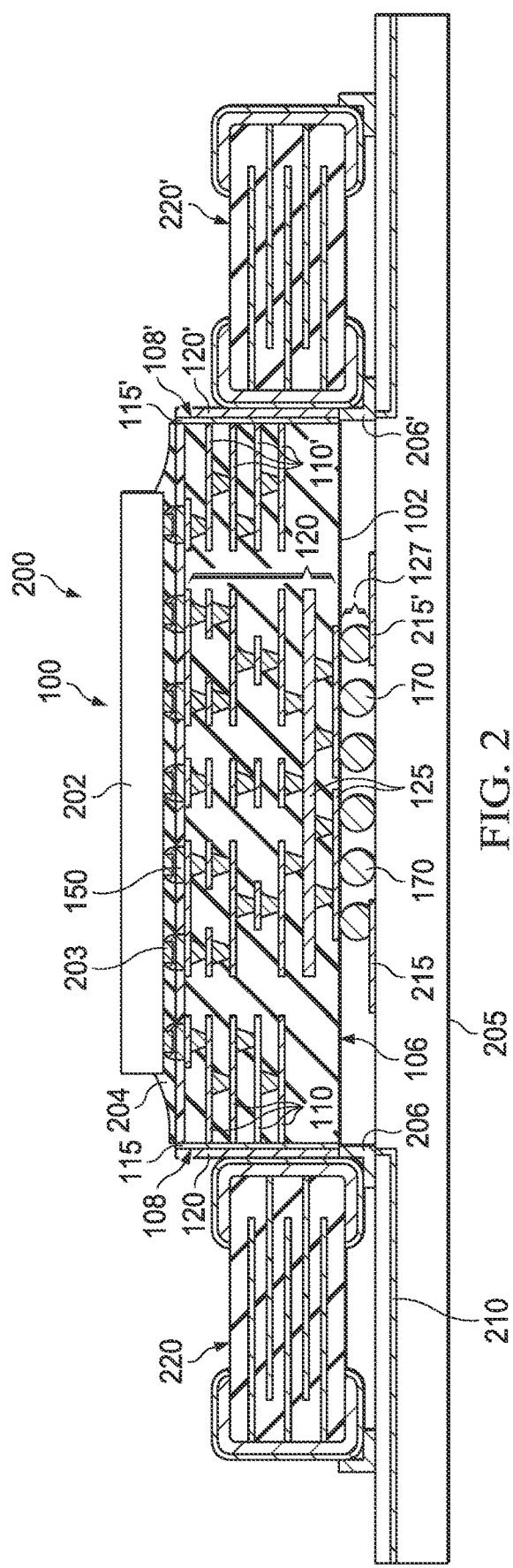
Figure 5:
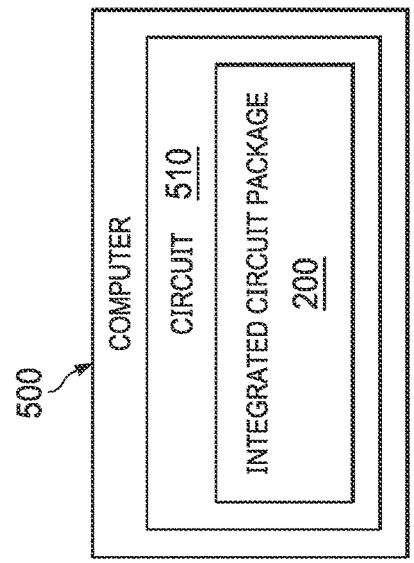
Figure 3:
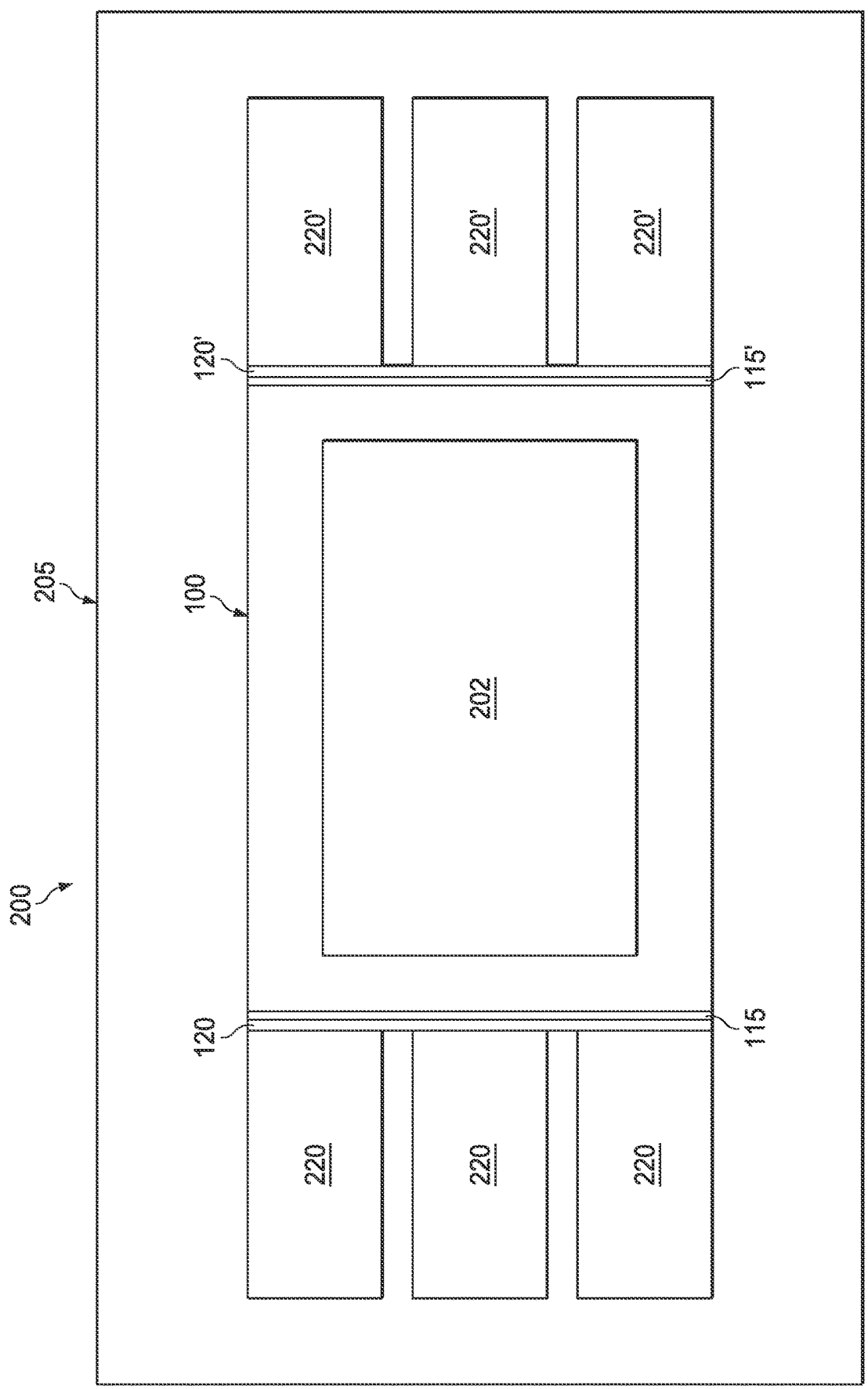
Figure 4:
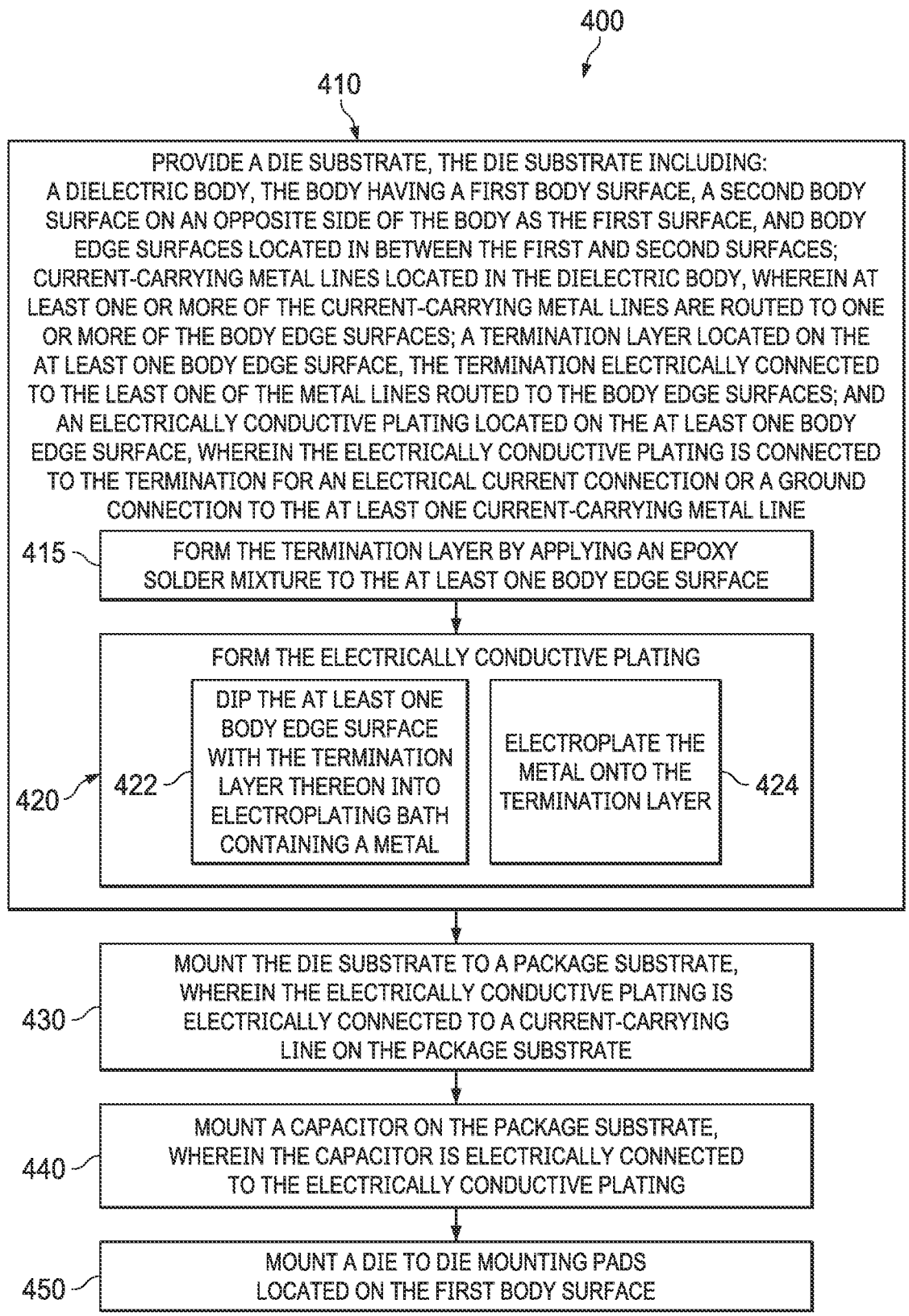

Reference is now made to the following descriptions taken in conjunction with the accompanying drawings, in which:

FIG. 1A presents a cross-sectional view of an example embodiment of a die substrate of the disclosure;

FIG. 1B presents a cross-sectional view of another example embodiment of the die substrate of the disclosure;

FIG. 2 presents a cross-sectional view of a die substrate of the disclosure such as any of embodiments of a die substrate to the die substrate discussed in the context of FIG. 1, located on a package substrate embodiment of the disclosure;

FIG. 3 presents a top down plan view of the die substrate and a package substrate, similar to the embodiments discussed in the context of FIGS. 1 and 2;

FIG. 4 presents a flow diagram of example embodiments of a method of manufacturing the die substrate according to the principles of the disclosure, including any of the die substrates disclosed in the context of FIGS. 1-3; and FIG. 5 presents a block diagram of a computer including one or more embodiments of the die substrate as part of an integrated circuit package of a circuit of the computer.

DETAILED DESCRIPTION

Embodiments of the disclosure follow from our discovery that the current-carrying solder balls, previously designed to provide current and ground connections to the die substrate, can be fully or partially removed from the BGA located on the underside of the die substrate. This was accomplished by routing current and ground connections to the edge of the die substrate via a termination layer and electrical plating layer on at least one of the edge surfaces of the die substrate body. Surprisingly, because the terminations and plating have a larger area than the total area of power-connected solder balls in a BGA, current conduction to the die can be advantageous increased. Additionally, because some or all of the current and ground connections are moved to the edge of the die substrate body, the number of current or ground connected solder balls in the BGA can be removed from the underside of the substrate. This, in turn, frees up space for solder balls in the BGA to be used for information signal routing to beneficially support higher memory bandwidth application. Further, for some embodiments, decoupling capacitors located on the PCB can be connected close the edge of the die substrate and therefore closer to the die to thereby provide an improved decoupling effect.

Our discovery was driven by the need to provide a new die substrate architecture to accommodate the increased integrated circuit power consumption requirements (e.g., up to 1000 W) to support higher memory bandwidth applications. Previous lower bandwidth applications with lower power requirements (e.g., up to 300 W) did not motivate the need for such a redesigned die substrate structure.

One embodiment of the disclosure is a die substrate. FIGS. 1A and 1B presents cross-sectional detailed views of portions of example embodiments of die substrate 100 of the disclosure.

As illustrated in FIGS. 1A and 1B, embodiments of the die substrate can include a dielectric body 102, the body having a first body surface 104, a second body surface 106 on an opposite side of the dielectric body as the first surface, and body edge surfaces 108 located in between the first and second surfaces. The substrate can also include current-carrying metal lines 110 located in the dielectric body, wherein at least one or more of the current-carrying metal lines are routed to one or more of the body edge surfaces. A termination layer 115 located on the at least one body edge surface is electrically connected to the least one of the metal lines routed to the body edge surfaces. An electrically conductive plating 120 located on the at least one body edge surface, is connected to the termination layer for an electrical current connection or a ground connection to the at least one of the current-carrying metal line.

As further illustrated the die substrate can further include signal-carrying metal lines 125 connected to a signal-carrying solder ball array 127 located on the second body surface 106 of the dielectric body.

In some embodiments, the die substrate can further include one or more of the current-carrying metal lines 110 connected to a current-carrying solder ball array 130 located on the second body surface 106 (FIG. 1B). In some such embodiments, a conductivity through a contact area 135 between one of the current-carrying metal lines 120 and the termination layer 115 can be greater (e.g., 2, 5, 10 times greater) than a conductivity through a contact area 137 between one of the current-carrying metal lines 130 connected to the solder ball array 132. For instance, the greater conductivity can be due to the contact area 135 between one of the current-carrying metal lines 120 and the termination layer 115 being greater (e.g., 2, 5, 10 times greater) than the contact area 137 between one of the current-carrying metal lines 130 connected to the solder ball array 132

As further illustrated, in some embodiments, the dielectric body 102 includes a stack of dielectric layers (140, . . . 145) where a top one (e.g., layer 140) of the dielectric layers provides the first body surface 102, a bottom one of the dielectric layers (e.g., 145) provide the second body surface 106, and the top, the bottom and intermediates ones of the dielectric layers each provide portions of the body edge surfaces 108. In some such embodiments some or all of the current-carrying metal lines 120 can be located on the dielectric layers 140 . . . 145 and metal vias (e.g., vias 147) can interconnect at least two of the metal lines that are each located on two different ones of the dielectric layer.

For some embodiments of the die substrate, some of the current-carrying metal lines 110 can be connected to die mounting pads 150 located on the first body surface 102. The die mounting pads 150 can be surrounded by a solder resist material 160 located on the first body surface 102, as familiar to those skilled in the art of lithographic patterning and deposition procedures.

For some embodiments of the die substrate, the current-carrying metal lines 110 and signal-carrying metal lines 125 can be connected to solder balls 170 of respective solder ball arrays 130, 127 located on the second body surface 106.

However, in other embodiments, the die substrate can be complete free of current-carrying metal lines 110 connected to a solder ball array on the second body surface 106, thereby freeing portions of the second body surface 106 for other purposes, such as accommodating a larger number of signal-carrying metal lines 125 that can be connected to a larger array 127 of signal carrying solder balls 170.

As a non-limiting example, whereas in the past 250 solder balls 170 could have carried current as part of a current-carrying array 130, and, 250 solder balls 170 could have carried signals as part of a signal-carrying array 127, embodiments of the disclosed die substrate 100 could use all 500 solder balls as part of the signal-carrying array 127. Or, the die substrate 100 could keep 250 solder balls as part of the signal-carrying area, but the layout effort and time to place the additional 250 solder balls for current carrying purposes could be reduced or avoided entirely.

FIG. 2 presents a cross-sectional of another example embodiment of the die substrate, such as any of the embodiments discussed in the context of FIG. 1A or 1B with the substrate located on a printed circuit board embodiment 200 of the disclosure.

In some embodiments the die substrate 100 is part of the integrated circuit 200 and a die 202 of the integrated circuit is mounted to the die mounting pads 150 located on the first body surface 104 of die substrate and connected to the current-carrying metal lines 110 (e.g., by microbumps 203, surrounded by an epoxy underfill 204, as familiar to one skilled in the pertinent art). Embodiments of the die, can be or include any of a central processing unit (CPU), a graphics processing unit (GPU), or other processing cores, or other circuit dies as familiar to those skilled in the pertinent arts, or, combinations thereof. E.g., in some embodiments the die 202 can be or include a graphics processing unit circuit die.

As a non-limiting example, in some embodiments the dielectric body 102 can be composed of a dielectric material, the termination layer 115 can be composed of a solder alloy and the electrically conductive plating 120 can composed of copper. For instance, embodiments of the dielectric material of the dielectric body 102, or its material layers 140, . . . 145, can be composed of, e.g., a ceramic dielectric material such as $CaZrO_3$ or $BaTiO_3$ or combinations thereof or similar materials familiar to those skilled in the pertinent art. For instance, embodiments of the solder alloy can be composed of AgPdCu or similar alloys familiar to those skilled in the pertinent art.

As illustrated in FIG. 2, the die substrate 100 can be part of an integrated circuit package 200 and the die substrate can be mounted to a package substrate 205 of the integrated circuit package, e.g., a printed circuit board package substrate 205. For instance, in some such embodiments, the electrically conductive plating 120 can be electrically connected (e.g., by solder connections 206, 206') to current-carrying lines 210 on the package substrate 205. Any such embodiments can further include signal-carrying metal lines 125 connected to a solder ball array 127 located on the second body surface 106, e.g., where solder balls 170 of the solder ball array 127 are electrically connected to signal-carrying lines 215 on the package substrate 205.

As illustrated in FIG. 2, and in the top down plan view of FIG. 3, any such embodiments of the package 200 can include one or more capacitors 220, 220' (e.g., decoupling capacitors) located on the package substrate 205, where each one of the capacitors 220, 220' is electrically connected to one of the electrically conductive platings 120, 120'.

As further illustrated in FIG. 2, some of the current-carrying metal lines 110' can be routed to a second one of the body edge surfaces 108', a second one of the termination layer 115' can be located on the second body edge surface, and a second one of the electrically conductive plating 120' can be connected to the second termination layer and the second capacitor 220' can be electrically connected to the second electrically conductive plating 120'.

Another embodiment of the disclosure is a method of manufacturing the die substrate. FIG. 4 presents a flow diagram of example embodiments of a method 400 of manufacturing the die substrate according to the principles of the disclosure, including any of the example embodiments of the die substrate 100 disclosed in the context of FIGS. 1A-3.

With continuing reference to FIGS. 1A-4 throughout, the method 400 includes providing (step 410) a die substrate 100, the die substrate. The die substrate 100 includes any embodiments of the die substrate 100 discussed in the context of FIGS. 1A-3, including the dielectric body 102, the current-carrying metal lines 110, the termination layer 115 and the electrically conductive plating 120.

For instance, the dielectric body can have a first body surface 104, a second body surface 106 on an opposite side of the body as the first surface, and body edge surfaces 108 located in between the first and second surfaces. The current-carrying metal lines 110 can be located in the dielectric body and at least one or more of the current-carrying metal lines can be routed to one or more of the body edge surfaces. The termination layer 115 can be located on the at least one body edge surface and electrically connected to the least one of the metal lines routed to the body edge surfaces. The electrically conductive plating 120 can be located on the at least one body edge surface and connected to the termination layer for an electrical current connection or a ground connection to the at least one current-carrying metal line.

In some such embodiments, providing (step 410) the die substrate can further include forming (step 415) the termination layer 115 by applying an epoxy solder mixture to the at least one body edge surface 108 and forming (step 420) the electrically conductive plating 120 by dipping (step 422) the at least one body edge surface 108 with the termination layer 115 thereon into an electroplating bath containing a metal and electroplating (step 424) the metal onto the termination layer.

As further illustrated in FIG. 4, some embodiments of the method 400 can further include mounting (step 430) the die substrate 100 to a package substrate 205, where the electrically conductive plating 120 is electrically connected to a current-carrying line 215 on the package substrate.

Embodiments of the method 400 can also include mounting (step 440) a capacitor 220 on the package substrate 205, wherein the capacitor 220 is electrically connected to the electrically conductive plating 120.

Embodiments of the method 400 can also include mounting (step 450) a die 202 to die mounting pads 150 located on the first body surface 102.

One skilled in the pertinent art would be familiar with how to form metal lines on layers of the die substrate or package substrate, and mounting the die, capacitors or other package components to the package substrate, e.g., using solder paste printing, electroplating, flip-chip, gluing, dipping flux or solder paste and reflow soldering techniques.

Another embodiment of the disclosure is an integrated circuit package 200 that includes any embodiments of the die substrate such as disclosed herein including any embodiments of the die substrate 100 discussed in the context of FIGS. 1-4.

For instance, embodiments of the die substrate can include the dielectric body 102, the body having a first body surface 104, a second body surface 106 on an opposite side of the body as the first surface, and body edge surfaces 108 located in between the first and second surfaces. The die substrate can include current-carrying metal lines 110, 110' located in the dielectric body, where at least one or more of the current-carrying metal lines are routed to one or more of the body edge surfaces. The die substrate can include one or more termination layers 115, 115' each located on the at least one body edge surface, the termination layers electrically connected to the least one of the metal lines routed to the body edge surfaces. The die substrate can include one or more electrically conductive platings 120, 120' located on the at least one body edge surface, where the electrically conductive plating is connected to the termination layer for an electrical current connection or a ground connection to the at least one current-carrying metal line.

Embodiments of the package 200 can include a die connected to die mounting pads 150 located on the first body surface 102 of the die substrate 100, where some of the current-carrying metal lines 110 are connected to die mounting pads 150. Embodiments of the package can include a package substrate 205, with the die substrate 100 is mounted to the package substrate 205 and the electrically conductive platings 120, 120' electrically connected to current-carrying lines 215, 215' on the package substrate 205. Embodiments of the package can include one or more capacitors 220, 220' located on the package substrate 205, where each one of the capacitors 220, 220' is electrically connected to one of the electrically conductive platings 120, 120'.

Another embodiment of the disclosure is computer having one or more circuits that include any embodiments of the integrated circuit package and die substrate as disclosed herein.

FIG. 5 present a block diagram of a computer 500 having one or more circuits 510 that include the integrated circuit package 200 having one or more embodiments of die substrate 100.

Those skilled in the art to which this application relates will appreciate that other and further additions, deletions, substitutions and modifications may be made to the described embodiments.

What is claimed is:

1. A die substrate, comprising:
   a dielectric body, the body having a first body surface, a second body surface on an opposite side of the dielectric body as the first surface, and body edge surfaces located in between the first and second surfaces;
   current-carrying metal lines located in the dielectric body, wherein at least one or more of the current-carrying metal lines are routed to one or more of the body edge surfaces;
   a termination layer located on the at least one body edge surface, the termination layer electrically connected to the least one of the metal lines routed to the body edge surfaces; and
      an electrically conductive plating located on the at least one body edge surface, wherein the electrically conductive plating is connected to the termination layer for an electrical current connection or a ground connection to the at least one the current-carrying metal line.

2. The die substrate of claim 1, further including signal-carrying metal lines connected to a signal-carrying solder ball array located on the second body surface.

3. The die substrate of claim 1, further including one or more of the current-carrying metal lines connected to a current-carrying solder ball array 130 located on the second body surface.

4. The die substrate of claim 3, wherein a conductivity through a contact area between one of the current-carrying metal lines and the termination layer is greater than a conductivity through a contact area between one of the current-carrying metal lines connected to the solder ball array.

5. The die substrate of claim 4, wherein the contact area between one of the current-carrying metal lines and the termination layer is greater than the contact area between one of the current-carrying metal lines connected to the solder ball array.

6. The die substrate of claim 1, wherein the dielectric body includes a stack of dielectric layers wherein a top one of the dielectric layers provides the first body surface, a bottom one of the dielectric layers provide the second body surface, and the top, the bottom and intermediates ones of the dielectric layers each provide portions of the body edge surfaces.

7. The die substrate of claim 6, wherein the current-carrying metal lines are located on the dielectric layers and metal vias interconnect at least two of the metal lines that are each located on two different ones of the dielectric layer.

8. The die substrate of claim 1, wherein some of the current-carrying metal lines are connected to die mounting pads located on the first body surface.

9. The die substrate of claim 8, wherein the die substrate is part of an integrated circuit wherein a die of the integrated circuit is mounted to the die mounting pads.

10. The die substrate of claim 9, wherein the die is a graphics processing unit circuit die.

11. The die substrate of claim 1, wherein the dielectric body is composed of a dielectric material, the termination layer is composed of a solder alloy and the electrically conductive plating is composed of copper.

12. The die substrate of claim 1, wherein the die substrate is part of an integrated circuit package and is mounted to a package substrate of the integrated circuit package.

13. The die substrate of claim 12, wherein the electrically conductive plating is electrically connected to current-carrying lines on the package substrate.

14. The die substrate of claim 12, further including signal-carrying metal lines connected to a solder ball array located on the second body surface 106, wherein solder balls of the solder ball array are electrically connected to signal-carrying lines on the package substrate.

15. The die substrate of claim 12, further including one or more capacitors located on the package substrate, wherein each one of the capacitors is electrically connected to one of the electrically conductive platings.

16. The die substrate of claim 12, wherein some of the current-carrying metal lines are routed to a second one of the body edge surfaces, a second one of the termination layer is located on the second body edge surface, and a second one of the electrically conductive plating is connected to the second termination layer and the second capacitor is electrically connected to the second electrically conductive plating.

17. An integrated circuit package, comprising:
   a die substrate, the die substrate including:
      a dielectric body, the body having a first body surface, a second body surface on an opposite side of the body as the first surface, and body edge surfaces located in between the first and second surfaces;
      current-carrying metal lines located in the dielectric body, wherein at least one or more of the current-carrying metal lines are routed to one or more of the body edge surfaces;
      one or more termination layers each located on the at least one body edge surface, the termination layers electrically connected to the least one of the metal lines routed to the body edge surfaces; and
      one or more electrically conductive platings located on the at least one body edge surface, wherein the electrically conductive plating is connected to the termination layer for an electrical current connection or a ground connection to the at least one current-carrying metal line;
   a die connected to die mounting pads located on the first body surface, wherein some of the current-carrying metal lines are connected to die mounting pads;
   a package substrate, wherein the die substrate is mounted thereto and the electrically conductive platings are electrically connected to current-carrying lines on the package substrate; and
   one or more capacitors located on the package substrate, wherein each one of the capacitors is electrically connected to one of the electrically conductive platings.

18. A computer having one or more circuits that include the integrated circuit package of claim 17.

* * * * *